United States Patent [19]

Dechelette

[11] Patent Number: 4,634,200

[45] Date of Patent: Jan. 6, 1987

[54] LOW PROFILE STACKING CONNECTOR FOR PRINTED CIRCUIT BOARDS

[75] Inventor: Helen Dechelette, Paris, France

[73] Assignee: Molex Incorporated, Lisle, Ill.

[21] Appl. No.: 759,778

[22] Filed: Jul. 29, 1985

[30] Foreign Application Priority Data

Aug. 11, 1984 [GB] United Kingdom ................. 8420472

[51] Int. Cl.[4] ................................................ H05K 1/00

[52] U.S. Cl. .............................. 339/17 M; 339/275 B; 339/221 M

[58] Field of Search .......... 339/220 R, 220 M, 221 R, 339/221 M, 258 R, 17 C, 17 M, 17 LM, 17 R

[56] References Cited

U.S. PATENT DOCUMENTS

| | | | |
|---|---|---|---|
| 3,596,235 | 7/1971 | Teurlings | 339/17 R |
| 4,157,207 | 6/1979 | Robinson | 339/221 M |
| 4,232,923 | 11/1980 | Otsuki et al. | 339/17 M |

FOREIGN PATENT DOCUMENTS

| | | | |
|---|---|---|---|
| 2448208 | 4/1975 | Fed. Rep. of Germany | 339/17 C |
| 2842892 | 4/1979 | Fed. Rep. of Germany | 339/17 C |

*Primary Examiner*—Gil Weidenfeld

*Assistant Examiner*—David L. Pirlot

*Attorney, Agent, or Firm*—Louis A. Hecht

[57] ABSTRACT

Disclosed is a connector arrangement for electrically interconnecting adjacent, parallel, spaced-apart printed circuit boards. The connector includes a housing having a mounting surface and passageway for receiving a pin-like male commoning element. The connector further includes a stamped, integral terminal mounted in the housing, which has a resilient female contact disposed in the pin-receiving passageway, and a board engaging portion which is secured to a first printed circuit board. A connector is provided on each printed circuit board to be electrically interconnected, and the pin-receiving passageways are aligned in registry. After installation of the connectors and printed circuit boards, the pin-like male commoning element is inserted through the passageways and apertures provided in each printed circuit board adjacent each passageway, so as to engage each female contact element of each connector to be interconnected.

The connector arrangement allows closer spacing of adjacent parallel spaced-apart printed circuit boards while requiring less mounting space.

15 Claims, 9 Drawing Figures

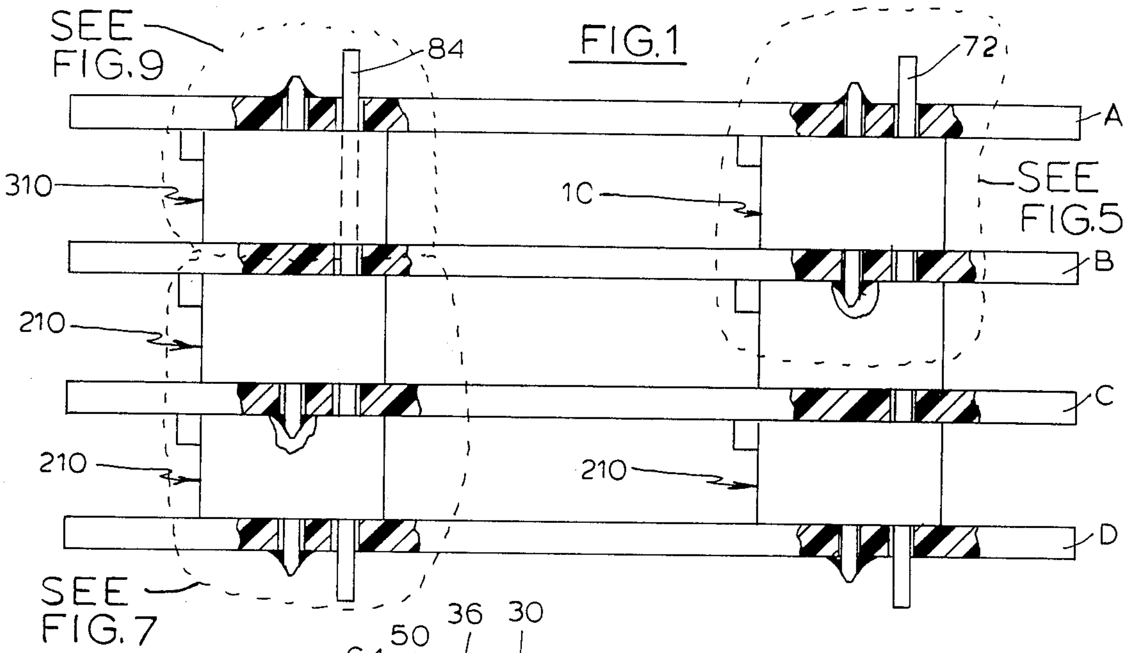
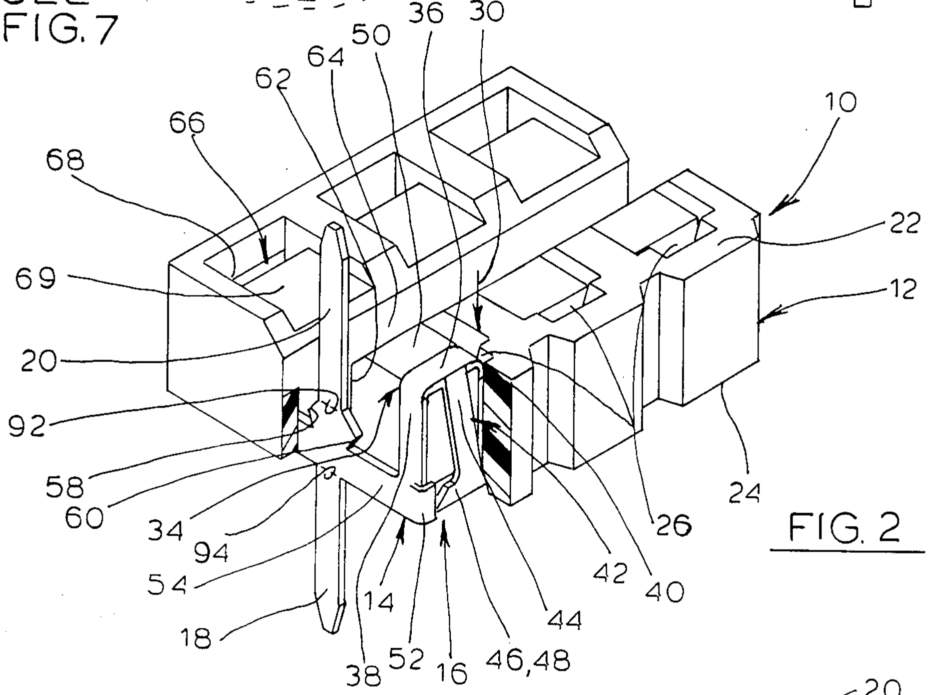
FIG. 2
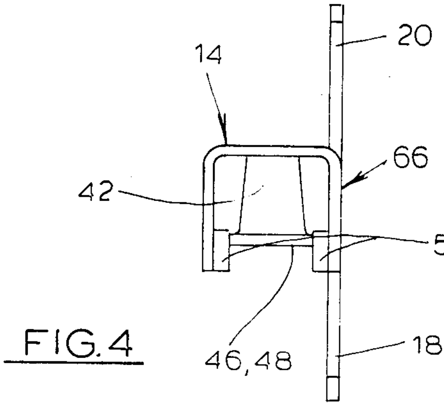
FIG.4
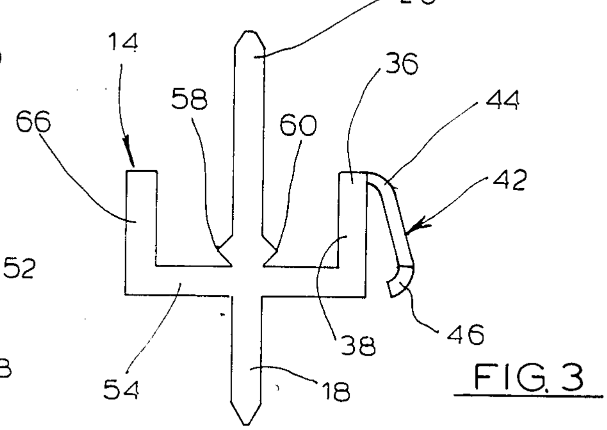
FIG.3

LOW PROFILE STACKING CONNECTOR FOR PRINTED CIRCUIT BOARDS

BACKGROUND OF THE INVENTION

1. Field of the Invention

The present invention relates to low profile stacking connectors for use with printed circuit boards, and particularly to connector arrangements which provide electrical interconnection between parallel, spaced-apart printed circuit boards.

2. A Brief Description of the Prior Art

Various connector arrangements have been provided for interconnecting parallel, spaced-apart printed circuit boards. These types of connectors have been referred to as "stacking connectors."

The earlier types of stacking connectors, located between two adjacent printed circuit boards, were comprised of two telescopically interfitting members, with one member mounted on each board. The arrangement, however, required considerable spacing between the printed circuit boards to accommodate the two connector members. As electronic components become miniaturized, a need arose for a low profile printed circuit board connector that allowed closer spacing between adjacent, parallel, spacedapart interconnected printed circuit boards.

One particular example of a low profile connector is given in U.S. Pat. No. 4,232,923—Otsuki, et al. Disclosed therein is a low profile connector having a terminal which is elongated in a direction parallel to the printed circuit board and perpendicular to the direction of insertion of the male commoning element. The elongated terminal has a plurality of bends which must be formed at close tolerances to accurately define the contact opening of the female connector element which receives the male commoning member. If any of the bends are not accurately formed, contact pressure would be greatly affected. Also, this connector, elongated in a direction parallel to the printed circuit board mounting surface, consumes space on the printed circuit board which is becoming increasingly valuable as components are mounted in increasingly higher densities.

Further, while the connector described above is of a low profile design, even closer stacking of adjacent printed circuit boards is required in many applications.

SUMMARY OF THE INVENTION

It is, therefore, an object of the present invention to provide an electrical connector for interconnecting printed circuit boards, which allows a closer spacing between printed circuit boards than was heretofore possible.

Another object of the present invention is to provide an electrical connector for interconnecting printed circuit boards which consistently provides required contact pressures and which has a unitary terminal member which is inexpensively fabricated from a stamped blank, with a minimum number of low tolerance forming steps.

A further object of the present invention is to provide a printed circuit board connector which allows close spacing of printed circuit boards while requiring less mounting space than was heretofore necessary.

These and other objects of the present invention are provided in an improved low profile stacking connector adapted for mounting to a first printed circuit board to provide electrical connection between the first printed circuit board and a pin connector which extends in a predetermined direction and is electrically associated with a second printed circuit board. The second printed circuit board is parallel to and spaced apart from the first printed circuit board. The stacking connector includes a housing having a top surface and a bottom surface, with at least one of the surfaces defining a board mounting surface for mounting on a first side of the first printed circuit board. The housing also has a pin receiving passageway. The connector further includes a stamped, integral terminal mounted in the housing, having a resilient female portion communicating with the pin receiving passageway, and being adapted to electrically mate with the pin connector as the pin connector is advanced in the predetermined direction. The terminal also has a board engaging portion extending out of the board mounting surface for electrical connection to said first printed circuit board, and means for retaining said terminal within said housing.

The improvement in the stacking connector comprises, as a feature of the resilient female portion, a spring-like cantilevered finger member which is struck out to extend obliquely relative to in the predetermined direction.

BRIEF DESCRIPTION OF THE DRAWINGS

In the drawings, wherein like elements are referenced alike,

FIG. 1 is a sectional elevational view of a plurality of printed circuit boards interconnected by various connectors according to the present invention;

FIG. 2 is a perspective view of a first connector according to the present invention for simultaneous mounting to two adjacent, parallel, spaced-apart printed circuit boards;

FIGS. 3 and 4 are elevational views of the terminal member of the connector of FIG. 2;

DETAILED DESCRIPTION OF THE PREFERRED EMBODIMENT

Figure 5:
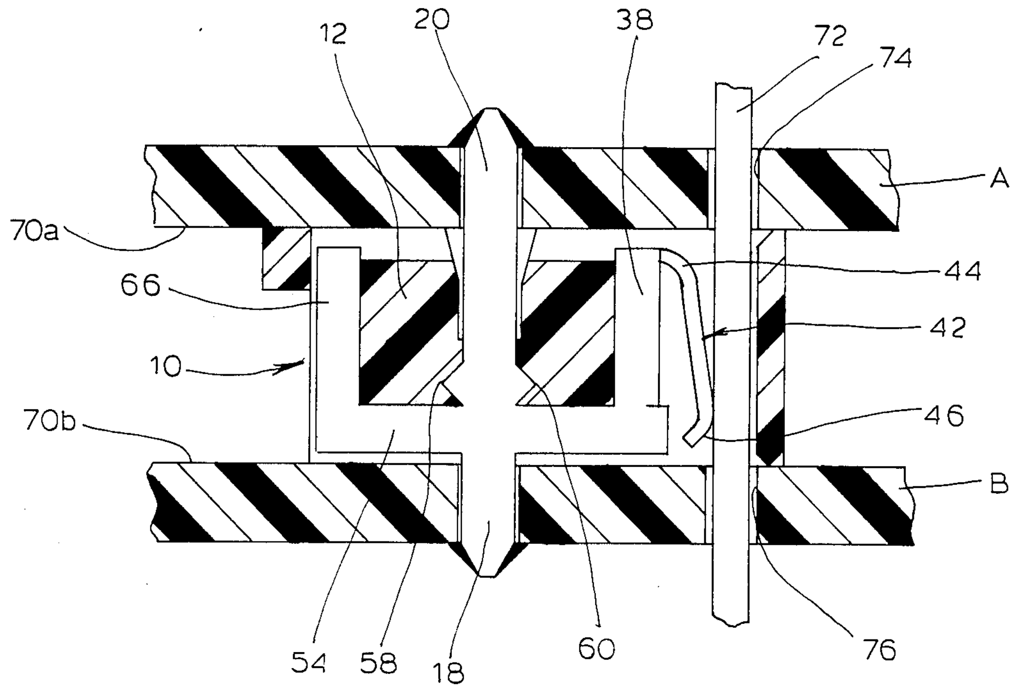
FIG. 5 is a cross-sectional view of the connector of FIG. 2, shown installed between two printed circuit boards. This figure is an enlarged detail of a portion of FIG. 1.

Referring now to the drawings, and especially to FIG. 1, an arrangement of several printed circuit boards designated A, B, C, and D are electrically interconnected using various connectors according to the present invention. As will be explained more fully below, connection is made by inserting a conductive pin-like commoning element through a series of printed circuit boards, so as to engage several of the connectors of the present invention, which are mounted on each of the printed circuit boards to be interconnected. Top, bottom, or both top and bottom mounting is provided by various embodiments of the present invention.

Referring now to FIG. 2, connector 10 includes an insulating housing 12 and a stamped integral conductive terminal member, designated generally at 14, mounted therein. As can be seen in FIGS. 2–4, terminal 14 includes a female portion, designated generally at 16, and board engaging portions 18,20. Housing 12 has mounting surfaces 22, 24 and a plurality of pin-receiving passageways 26. For purposes of clarity, only one terminal member 14 is shown installed in housing 12. A pin-like or male commoning element is inserted in connector 10 in the direction of arrow 30. If additional terminals are installed in housing 12, then additional male commoning elements can be received in each terminal for a separate electrical connection.

Referring especially to FIGS. 3 and 4, the female portion 16 of terminal 14 includes a U-shaped support members, designated generally at 34, having a central portion 36 and two leg portions 38, 40. A struck-out finger member 42 is joined at a first end 44 to central portion 36, and has a contact camming surface 46 at its free end 48. As can be seen in FIG. 1, finger member 42 is partially surrounded by support member 34, and is struck out therefrom to extend obliquely relative to the direction of arrow 30, i.e. the direction of insertion of the commoning element. Housing 12 includes a shoulder 50 which engages central support portion 36 so as to retain terminal 14 in housing 12. Tangs 52, located adjacent leg portions 38, 40, also engage shoulder 50 to aid in terminal retention. An interconnecting member 54 interconnects leg portion 38 of female portion 16 and board engaging members 18, 20. Barb-like projections 58, 60, formed adjacent the board-engaging members, engage the sidewalls 62 of a cavity 64 formed in housing 12, to further aid in retaining terminal 14 in position.

If needed for still additional retention, a second support member, designated generally at 66, integrally formed with terminal 14, can be provided. The second support 66 is U-shaped, being substantially identical in appearance to support member 34, but for the omission of a finger like contact member. The second support 66 may be dimensioned so as to be frictionally engaged within second support cavity 68, or may engage a second, optional, shoulder 69. As can be seen in FIG. 3, the second support 66 is joined to the remainder of terminal 14 through interconnecting member 54.

Referring now to FIG. 5, connector 10 described above provides both top and bottom mounting for attachment to two parallel closely-spaced printed circuit boards designated by the letters A and B. The cross-sectional view of FIG. 5 shows the installed connector 10 of FIG. 1 in greater detail. Connector 10 provides both top and bottom entry of the its board engaging members into the printed circuit boards, for solder or the like electrical engagement therewith. In FIG. 5, surface 70A is understood to be a component mounting side of printed circuit board A, and surface 71A is the remote, or component securement side of that board to which the components are affixed by soldering or the like. Similarly, surface 70B is a component mounting side of printed circuit board B, with the components being affixed to opposing component securement surface 71B. In FIG. 5, the end of board engaging member 20 is soldered to surface 71A of printed circuit board A, and the end of board engaging portion 18 is likewise soldered to surface 71B of printed circuit board B. As can be seen, board engaging members 18,20 extend out of board mounting surfaces 24, 22, of housing 12, respectively. After installation of connector 10 and printed circuit boards A and B, a pin-like commoning element 72 is inserted in apertures 74, 76 of printed circuit boards A and B respectively. Insertion of pin 72 deflects finger contact 42, thereby establishing electrical contact with connector 10. Pin 72 is held in an engagement with connector 10, between the camming surface 46 of finger 42 and an adjacent side wall 80 of housing 12. The stacking connector of this arrangement will typically provide electrical connection of a third printed circuit board, such printed circuit board 10 shown in FIG. 1. However, connector 10 can also provide electrical connecting to another type of external circuit member, via connector pin 72. One example of this latter arrangement is found where discrete wire is connected between pin 72 and another printed circuit portion which may or may not include a printed circuit board.

Figure 6:
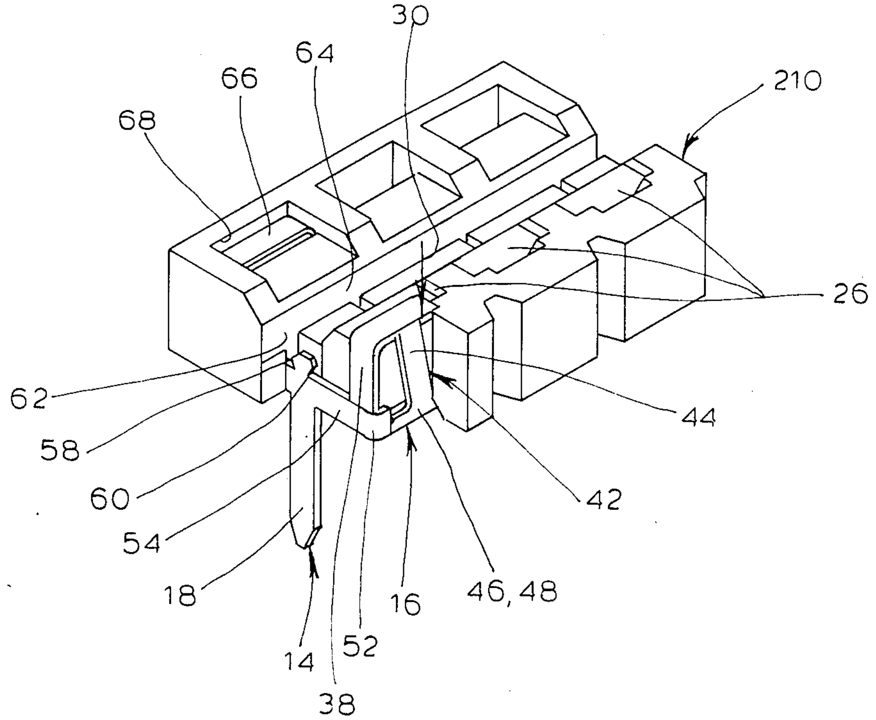
FIG. 6 is a perspective view of another embodiment of the present invention which provides "top entry" mounting of the connector on a printed circuit board.

The remaining two embodiments of the connector of the present invention are substantially identical to connector 10, except for the omission of either board engaging member 18 or 20. For example, if the second board engaging member 20 is removed from the arrangement of FIG. 2 by cutting at dotted line 92, the connector 10 of FIG. 2 becomes a "top entry" connector 210 shown in FIG. 6. Only mounting surface 24 will be employed in this embodiment for engagement with a printed circuit board. Except for the omission of board engaging number 20, connector 210 is identical to connector 10 described above.

Figure 7:
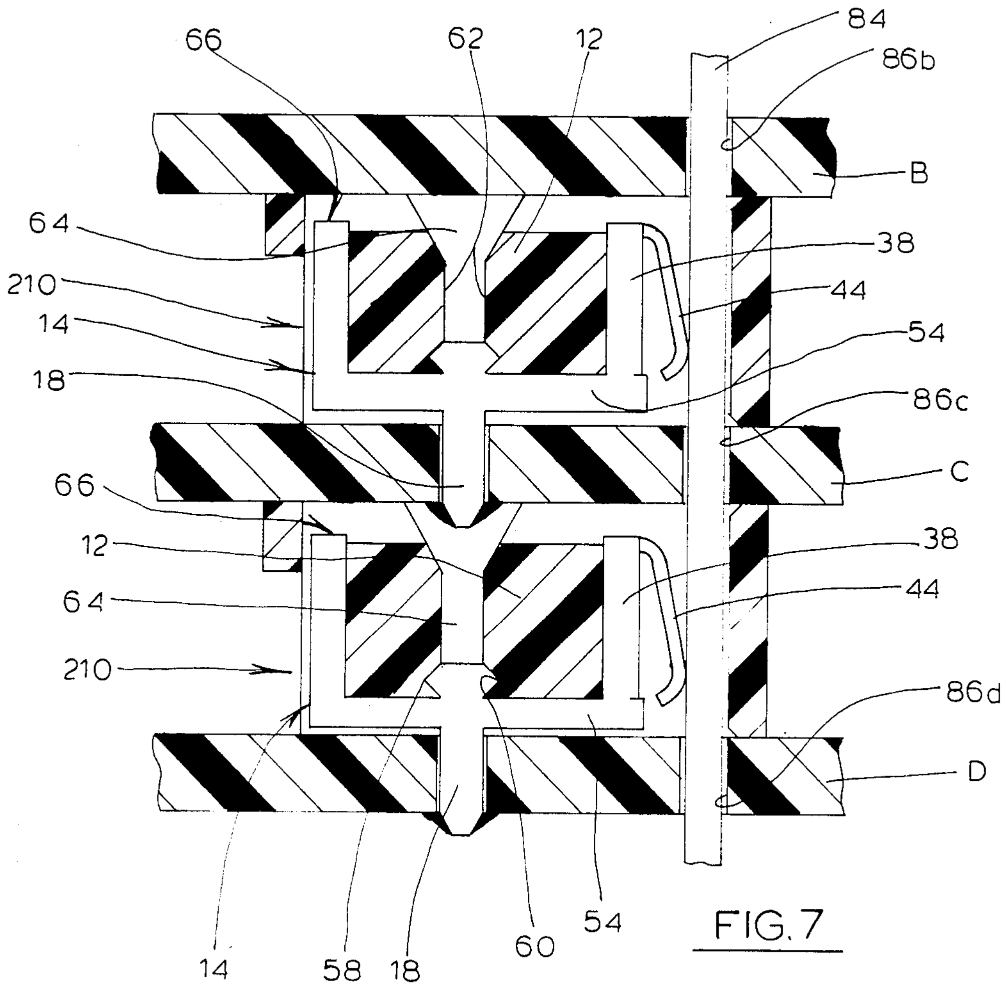
FIG. 7, an enlarged detail of a portion of FIG. 1, shows two of the connectors of FIG. 6 installed in two adjacent printed circuit boards.

FIG. 7 shows two connectors 210 in a stacked, adjacent arrangement which interconnects printed circuit boards C and D. The heretofore unknown close spacing between adjacent printed circuit boards C and D is made possible by the "top entry" connector 210 of the present invention. As can be seen most clearly in FIG. 6, a cavity 64, located adjacent board engaging member 18, and communicating with housing surface 24, is provided in housing 12 for receiving an end of a board engaging member of another connector arrangement, such as another connector 210. Cross member 54 is located immediately adjacent board mounting surface 24, and board engaging member 18 is arranged to one side of interconnecting member 54 so as not to extend into cavity 64. Only the optional barb-like retaining projections 58, 60 are contained in cavity 64, and only at a lower most portion thereof. Thus, with reference to FIG. 7, the upper connector 210 can be located directly over lower connector 210, with the portion of the upper board engaging member extending below printed circuit board C, being nested within cavity 64 of the lower connector 210. As can be seen with reference to FIG. 7, pin-like commoning element 84 is inserted through apertures 86B, 86C, and 86D, so as to be received within upper and lower connectors 210. As explained above with reference to FIG. 5, pin 84 is held captive between the spring-like finger contact 42 of each connector 210, and the adjacent side wall of each respective connector housing.

Figure 8:
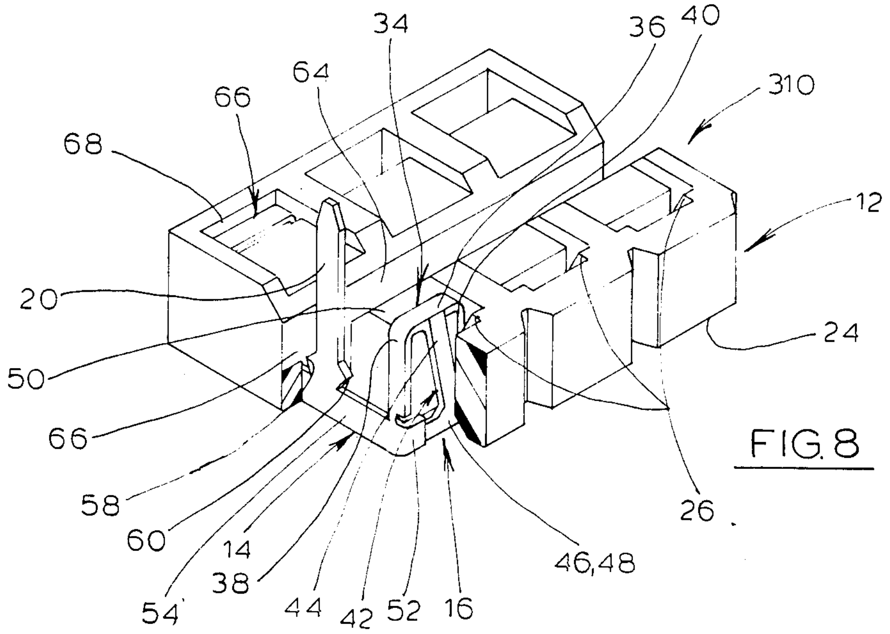
FIG. 8 is a perspective view of a third embodiment of the present invention which provides "bottom entry" mounting of the connector to a printed circuit board.
Figure 9:
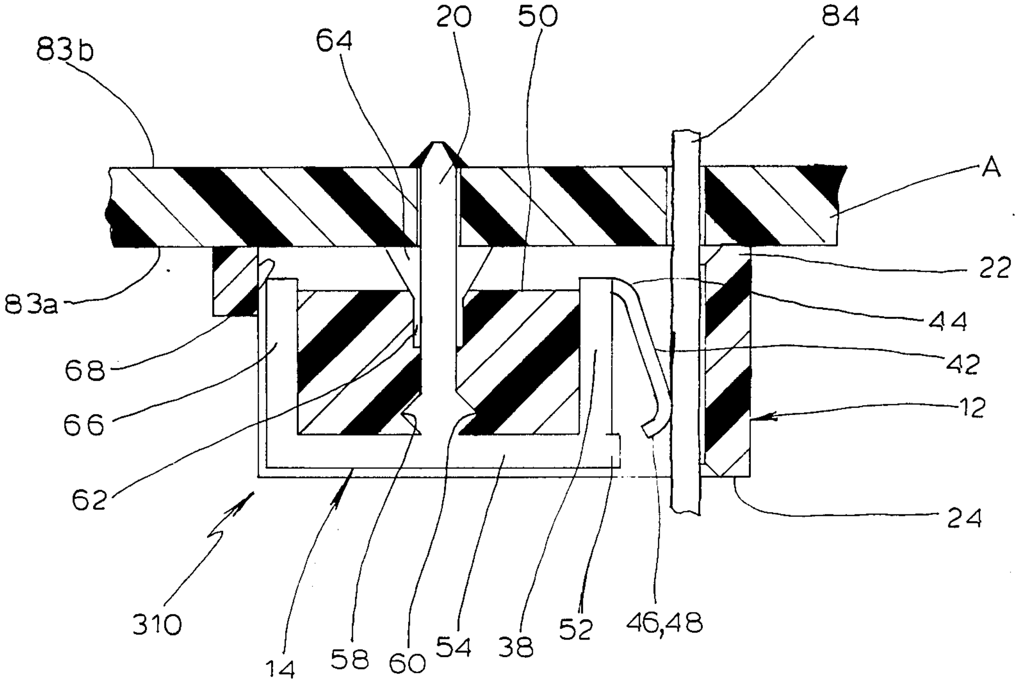
FIG. 9, an enlarged detail of a portion of FIG. 1, shows the connector of FIG. 8 installed in a printed circuit board.

Referring now to FIG. 8, a "bottom entry" connector 310 is shown in perspective. If the first board engaging member 18 of the connector of FIG. 2 is removed by cutting at dotted line 94, the connector 310 will be realized. Connector 310 is in all other respects identical to connector 10, which was explained above with reference to FIGS. 2–4. Referring to FIG. 9, a detailed enlargement of a portion of FIG. 1, connector 310 is mounted to the underside surface 83*a* of printed circuit board A. A free end of board engaging member 20, which extends out of board mounting surface 22, is secured to the opposite side 83*b* of printed circuit board A by solder or the like connection means. As explained above with reference to connectors 10 and 210, connector 310 retains a pin like commoning element 84 between the spring-like finger contact 42 and the adjacent side walls 80 of connector housing 12.

In any event, the mounting surface of the connector of the present invention will be positioned adjacent the component side of a printed circuit board, with the board engaging member protruding through the opposite side of the printed circuit board so as to be soldered or otherwise secured thereto. The pin-receiving passageways of the connectors to be electrically interconnected must be aligned in registry, so that the conductive pin-like commoning element can engage the respective female contact fingers of each connector. As will be appreciated by those skilled in the art, the integral terminal of the present invention need not necessarily be stamped from a flat blank. However, the terminal of the preferred embodiment is stamped for reasons of economy.

Thus it can be seen that the connector of the present invention provides improved, consistent contact pressure in a connector package having reduced board-to-board spacing and reduced mounting space requirements.

We claim:

1. A low profile stacking connector adapted for mounting to a first printed circuit board to provide electrical connection between said first printed circuit board and a pin connector extending in a predetermined direction and electrically associated with a second printed circuit board which is parallel to and spaced apart from said first printed circuit board, said stacking connector including:

a housing having a top surface and a bottom surface, at least one of said surfaces defining a board mounting surface for mounting on a first side of the first printed circuit board, and a pin receiving passageway; and a stamped integral terminal mounted in said housing, having a resilient female portion mounted in said pin receiving passageway and being adapted to electrically mate with the pin connector as the pin connector is advanced in the predetermined direction, a board engaging portion extending out of the board mounting surface for electrical connection to said first printed circuit board, and means for retaining said terminal within said housing;

the improvement in said stacking connector comprising:

said resilient female portion including a spring-like cantilevered finger member struck out to extend obliquely relative to said predetermined direction;

said terminal being formed from flat, metal stock and including an interconnecting member interconnecting the female portion to the board engaging portion, said female portion of said terminal including a support member from which said finger member depends, and said support member cooperating with said housing to define said retaining means;

said support member including a generally U-shaped portion and said housing further including shoulder means for engaging said U-shaped portion;

said board engaging portion disposed in a first plane perpendicular to said first printed circuit board and said U-shaped portion disposed in a second plane generally perpendicular to said first plane and said printed circuit board; and said retaining means including a second generally U-shaped terminal support portion interconnected with said board engaging portion by said interconnecting member; and a second housing shoulder means which engages the second U-shaped portion.

2. The connector of claim 1 wherein said second U-shaped member lies in a third plane generally parallel to and spaced apart from, said second plane.

3. A printed circuit board assembly including:

an arrangement of upper and lower printed circuit boards which are parallel to and spaced-apart from each other, each printed circuit board having a component mounting surface and an opposed remote surface;

a first, stacking connector mounted on the upper surface of said upper printed circuit board, including a housing having a pin receiving passageway and an integral terminal mounted in said housing, said terminal having a board engaging portion electrically connected to said upper printed circuit board, said board engaging portion having a free end extending below said upper printed circuit board;

a pin connector extending in a predetermined direction and electrically associated with said upper printed circuit board;

a second, low profile, stacking connector mounted on a first surface of said lower printed circuit board to provide electrical connection between said first and said second printed circuit boards, said second connector including:

a housing having a top surface and a bottom surface, at least one of said surfaces defining a board mounting surface for mounting on said first surface of said lower printed circuit board, and a pin receiving passageway; and a stamped integral terminal mounted in said housing, having a resilient female portion communicating with said pin receiving passageway and being adapted to electrically mate with the pin connector as the pin connector is advanced in the predetermined direction, a board engaging portion extending out of the board mounting surface for electrical connection to said lower printed circuit board, and means for retaining said terminal within said housing;

the improvement in said second stacking connector comprising:

said resilient female portion including a spring-like cantilevered finger member struck to extend obliquely relative to said predetermined direction;

said board mounting surface of the housing being the bottom surface and the second stacking connector further including means for accommodating said free end of said board enaging portion of said upper stacking connector; and said accommodating means comprises a cavity formed in said housing adjacent said board engaging portion and communicating with said top surface.

4. The second stacking connector of claim 3 wherein said housing includes a shoulder means, said female portion of said terminal includes a U-shaped support member from which said finger member depends, and said support member cooperates with said housing shoulder to define said retaining means.

5. A printed circuit board assembly including:

at least three parallel, spaced-apart printed circuit boards, each board having opposed top and bottom surfaces, with at least one surface defining a component securing surface, each adjacent pair of boards having facing surfaces defined by the bottom surface of one board and the top surface of the adjacent board;

at least two stacking connectors, one between each pair of adjacent printed circuit boards, for electrically interconnecting at least two of said printed circuit boards, each connector having a housing with a pin receiving passageway and a terminal mounted in said housing with a female portion mounted in the pin receiving passageway and a board engaging portion extending out of the housing for electrical connection to a component securing surface of an adjacent printed circuit board; and pin connector means received within the pin receiving passageway of each connector for electrically connecting the connectors to one another;

the improvement comprising:

the board engaging portion of each terminal having an end extending through the securing surface of the printed circuit board to which it is connected; and the housing of one stacking connector located between one pair of adjacent printed circuits boards including a cavity adapted to accommodate said board engaging portion end of an adjacent stacking connector.

6. The assembly of claim 5 wherein said printed circuit boards define pin receiving holes formed therein, said pin receiving holes and said pin receiving passageways being aligned in registry; and said pin connector means includes a unitary elongated pin connector of sufficient length to be received through all of said pin receiving holes and said pin receiving passageways.

7. The assembly of claim 6 wherein the connector terminal comprises and integral stamped terminal and said female terminal portion includes a struck out resilient member which engages said pin connector means.

8. The assembly of claim 7 wherein said connector housings each have a pair of opposed surfaces which abutt the facing surfaces of adjacent printed circuit boards.

9. The assembly of claim 8 wherein said board engaging portions of said terminals are aligned in registry.

10. The assembly of claim 8 wherein at least one of said connectors further includes another board engaging portion extending out of the housing in a direction opposite to said one board engaging portion for electrical connection to a component securing surface of the other adjacent printed circuit board.

11. The assembly of claim 7 further including means for retaining said terminal in said housing.

12. A printed circuit board assembly including:

a pair of parallel adjacent spaced-apart printed circuit boards, each board having opposed top and bottom surfaces, with at least one surface defining a component securing surface, said pair of printed circuit boards having facing surfaces defined by the bottom surface of one board and top surface of the other, adjacent board;

a stacking connector located between said pair of adjacent printed circuit boards for electrically interconnecting said pair of printed circuit boards to a pin connector means, said stacking connector having a housing with two opposed surfaces and a pin receiving passageway and further having a terminal mounted in said housing with a female portion mounted in the pin receiving passageway and at least two opposed board engaging portions extending out of the opposed surfaces of the housing for electrical connection to a component securing surface of each printed circuit board, respectively;

pin connector means electrically associated with a third printed circuit board, being received within the pin receiving passageway for electrical connection to the stacking connector;

said printed circuit boards defining a pin receiving hole formed therein, said pin receiving holes and said stacking connector pin receiving passageway being aligned in registry; and said pin connector means including a unitary elongated pin connector of sufficient length to be received through all of said pin receiving holes and said pin receiving passageway.

13. The assembly of claim 12 wherein the connector housing opposed surfaces abutt the facing surfaces of the pair of printed circuit boards.

14. The assembly of claim 13 wherein the connector terminal comprises an integral stamped terminal and said female terminal portion includes a struck out resilient finger member which engages said pin connector.

15. The assembly of claim 14 wherein said pin connector is electrically associated with a third printed circuit board which is parallel to, and spaced-apart from, said pair of printed circuit boards.

* * * * *